United States Patent
Tsukizawa

(10) Patent No.: US 8,067,995 B2
(45) Date of Patent: Nov. 29, 2011

(54) VOLTAGE CONTROLLED OSCILLATOR, AND PLL CIRCUIT AND WIRELESS COMMUNICATION DEVICE EACH USING THE SAME

(75) Inventor: Takayuki Tsukizawa, Osaka (JP)

(73) Assignee: Panasonic Corporation, Osaka (JP)

( * ) Notice: Subject to any disclaimer, the term of this patent is extended or adjusted under 35 U.S.C. 154(b) by 91 days.

(21) Appl. No.: 12/601,621

(22) PCT Filed: Mar. 17, 2009

(86) PCT No.: PCT/JP2009/001189
§ 371 (c)(1),
(2), (4) Date: Nov. 24, 2009

(87) PCT Pub. No.: WO2009/119042
PCT Pub. Date: Oct. 1, 2009

(65) Prior Publication Data
US 2010/0171557 A1 Jul. 8, 2010

(30) Foreign Application Priority Data
Mar. 28, 2008 (JP) .................................. 2008-086655

(51) Int. Cl.
*H03B 5/12* (2006.01)
(52) U.S. Cl. .................. 331/177 V; 331/179; 331/36 C; 331/117 FE
(58) Field of Classification Search .............. 331/117 R, 331/117 FE, 167, 177 V, 36 C, 179, 17
See application file for complete search history.

(56) References Cited

U.S. PATENT DOCUMENTS
7,170,358 B2 * 1/2007 Tsukizawa et al. ....... 331/177 V

| | | |
|---|---|---|
| 2003/0227341 A1 | 12/2003 | Sawada |
| 2005/0190002 A1 | 9/2005 | Takinami et al. |
| 2007/0075798 A1 | 4/2007 | Amano |

FOREIGN PATENT DOCUMENTS

| | | |
|---|---|---|
| JP | 2003-324316 | 11/2003 |
| JP | 2004-15387 | 1/2004 |
| JP | 2004-147310 | 5/2004 |
| JP | 2007-104152 | 4/2007 |

OTHER PUBLICATIONS

International Search Report issued Jun. 2, 2009 in International (PCT) Application No. PCT/JP2009/001189.

* cited by examiner

*Primary Examiner* — Ryan Johnson
(74) *Attorney, Agent, or Firm* — Wenderoth, Lind & Ponack, L.L.P.

(57) ABSTRACT

A voltage controlled oscillator includes first and second variable capacitance circuits 120 and 130, and first and second capacitance switch circuits 140 and 150. A control voltage Vt is fixedly applied to the first variable capacitance circuit 120, and control signals Fsel2 and Fsel3 are fixedly applied to the first and second capacitance switch circuits 140 and 150, respectively. When both of the control signals Fsel2 and Fsel3 are at a low level, the control signal Fsel1 is applied to the second variable capacitance circuit 130. When the control signals Fsel2 and Fsel3 are both not at the low level, the control voltage Vt is applied to the second variable capacitance circuit 130. As a result of this control, a high-frequency variable range is divided into two variable ranges, one based on upper frequencies and the other based on lower frequencies. This enables suppression of a frequency sensitivity without narrowing the high-frequency variable range.

6 Claims, 16 Drawing Sheets

| | 000 | 001 | 01* | 10* | 11* |
|---|---|---|---|---|---|
| Fsel1 | L | H | — | — | — |
| Fsel2 | L | L | H | L | H |
| Fsel3 | L | L | L | H | H |
| CONNECTION POINT B | L | H | Vt | Vt | Vt |

| | 000 | 001 | 010 | 011 | 10* | 11* |
|---|---|---|---|---|---|---|
| Fsel1 | L | H | L | H | — | — |
| Fsel2 | L | L | H | H | L | H |
| Fsel3 | L | L | L | L | H | H |
| CONNECTION POINT B | L | H | Vt | Vt | Vt | Vt |
| CONNECTION POINT C | L | H | L | H | Vt | Vt |

| Fsel1 | Fsel2 | VARIABLE CAPACITANCE | | | FIXED CAPACITANCE | | | | sw |
|---|---|---|---|---|---|---|---|---|---|
| | | mosv0 | mosv1 | mosv2 | mosv3 | mosv4 | mosv5 | mosv6 | |
| L | L | Vt | L | L | Vt | Vt | Vt | Vt | L |
| H | L | Vt | H | H | Vt | Vt | Vt | Vt | L |
| – | H | Vt | Vt | Vt | Vt | Vt | Vt | Vt | H |

<HIGH BAND>

| Fsel1 | Fsel2 | Fsel3 | VARIABLE CAPACITANCE ||| FIXED CAPACITANCE |||| sw |
|---|---|---|---|---|---|---|---|---|---|---|
| | | | mosv0 | mosv1 | mosv2 | mosv3 | mosv4 | mosv5 | mosv6 | |
| L | L | L | Vt | L | L | L | L | L | L | L |
| H | L | L | Vt | L | L | H | L | L | L | L |
| L | H | L | Vt | Vt | L | H | H | L | L | L |
| H | H | L | Vt | Vt | L | H | H | L | L | H |
| — | L | H | Vt | Vt | Vt | H | H | H | L | H |
| — | H | H | Vt | Vt | Vt | H | H | H | H | H |

<LOW BAND>　　　　<HIGH BAND>

<LOW BAND>　　　　<HIGH BAND>

VOLTAGE CONTROLLED OSCILLATOR, AND PLL CIRCUIT AND WIRELESS COMMUNICATION DEVICE EACH USING THE SAME

TECHNICAL FIELD

The present invention relates to a voltage controlled oscillator used for, for example, generating a local oscillation signal for a wireless communication device, and also relates to a PLL circuit and a wireless communication device each using the same.

BACKGROUND ART

A voltage controlled oscillator is widely used as means for generating a local oscillation signal for a wireless communication device. When the voltage controlled oscillator is manufactured as a radio frequency IC, it is necessary to increase an oscillation frequency range thereof, in order to accommodate variations among components thereof, which occur in a semiconductor manufacturing process. Moreover, in recent years, a demand arises that an oscillation frequency of a voltage controlled oscillator be adjustable in a wide frequency range so as to adapt the voltage controlled oscillator to communication systems using different frequency bands.

FIG. 13 is a diagram showing an exemplary configuration of a conventional voltage controlled oscillator 1d having an increased oscillation frequency range (for example, Patent Document 1). In FIG. 13, the conventional voltage controlled oscillator 1d includes: an inductor circuit having inductors 3; a first variable capacitance circuit formed with variable capacitance elements 4; a second variable capacitance circuit formed with variable capacitance elements 5; a third variable capacitance circuit formed with variable capacitance elements 6; a negative resistance circuit formed with transistors 9; a bias circuit 16; and switches 54 and 55. The inductor circuit, the first to third variable capacitance circuits, and the negative resistance circuit are connected in parallel with each other, and thus form an oscillation circuit.

In the conventional voltage controlled oscillator 1d, the switch 54 or 55 switches the direction of connection of a capacitance value control terminal of at least one of the two variable capacitance elements 5 and 6 which are provided in parallel with each other. This can cover different oscillation frequency ranges in accordance with the switched direction of connection. Thus, a plurality of kinds of oscillation frequency characteristics, having a lowered frequency sensitivity, can be obtained. The frequency sensitivity indicates a rate of variation of the oscillation frequency with respect to a frequency control voltage.

Patent Document 1: Japanese Laid-Open Patent Publication No. 2007-104152

DISCLOSURE OF THE INVENTION

Problems to be Solved by the Invention

However, in the conventional voltage controlled oscillator 1d, the variable capacitance elements 5 and 6 are all to be controlled by the switching of the switches 54 and 55 in order to cover a wide oscillation frequency range. This involves the following problems.

Firstly, when a variable capacitance element is used as a fixed capacitor; even if a voltage applied to the variable capacitance elements 5 and 6 is set to 0 V or Vdd, a potential difference across the opposite ends of the variable capacitance element reaches a level where a capacitance variation occurs, due to an oscillation amplitude on the resonance line side. Thus, there is a problem that, when a noise is added to a power supply voltage or a control voltage, phase noise characteristics deteriorate. Therefore, it is desirable to minimize the number of variable capacitance elements used as fixed capacitors.

Secondly, as shown in FIG. 14, a variable capacitance element using a MOS transistor (dotted lines in FIG. 14) exhibits a lower capacitance variation ratio than a capacitance switch circuit (solid lines in FIG. 14) does. Accordingly, there is a problem that a voltage controlled oscillator using only variable capacitance elements has a narrower frequency variable range than a voltage controlled oscillator including a capacitance switch circuit does. Thus, effective use of the capacitance switch circuit is desirable.

Therefore, an object of the present invention is to provide: a voltage controlled oscillator capable of, while suppressing deterioration of phase noise characteristics, variably controlling an oscillation frequency over a wide range with a frequency sensitivity being kept low; and a PLL circuit and a wireless communication device each using the voltage controlled oscillator.

Solution To The Problems

The present invention is directed to a voltage controlled oscillator, and a PLL circuit and a wireless communication device each using the voltage controlled oscillator. To achieve the above-described object, a voltage controlled oscillator of the present invention includes: an inductor circuit including an inductor; a plurality of variable capacitance circuits each including a variable capacitance element; at least one capacitance switch circuit; a negative resistance circuit; and a frequency sensitivity controller that applies a control voltage and a control signal to the plurality of variable capacitance circuits and the at least one capacitance switch circuit. The inductor circuit, the plurality of variable capacitance circuits, the at least one capacitance switch circuit, and the negative resistance circuit are connected in parallel. The frequency sensitivity controller: is connected to a respective virtual ground point for differential signals of each of the plurality of variable capacitance circuits; fixedly applies the control voltage for feedback control of an oscillation frequency, to at least one of the plurality of variable capacitance circuits; and applies either one of the control voltage and the control signal, to at least one other of the plurality of variable capacitance circuits, based on at least one control signal applied to the at least one capacitance switch circuit.

In this configuration, it is preferable that the frequency sensitivity controller applies the control signal to the at least one other of the plurality of variable capacitance circuits, when the control signal at a low level which does not cause switch-on is applied to all of the at least one capacitance switch circuit. Moreover, it is preferable that the frequency sensitivity controller applies the control voltage to all of the plurality of variable capacitance circuits, when the control signal at a high level which causes switch-on is applied to all of the at least one capacitance switch circuit. It is noted that the control signal applied to the at least one other of the plurality of variable capacitance circuits has two voltage levels of a low level and a high level. In addition, it is preferable that at least one of the variable capacitance elements of the plurality of variable capacitance circuits has an Inversion type MOS structure or an Accumulation type MOS structure.

Effect Of The Invention

The present invention makes it possible to, while suppressing deterioration of phase noise characteristics, variably con-

Figure 1:
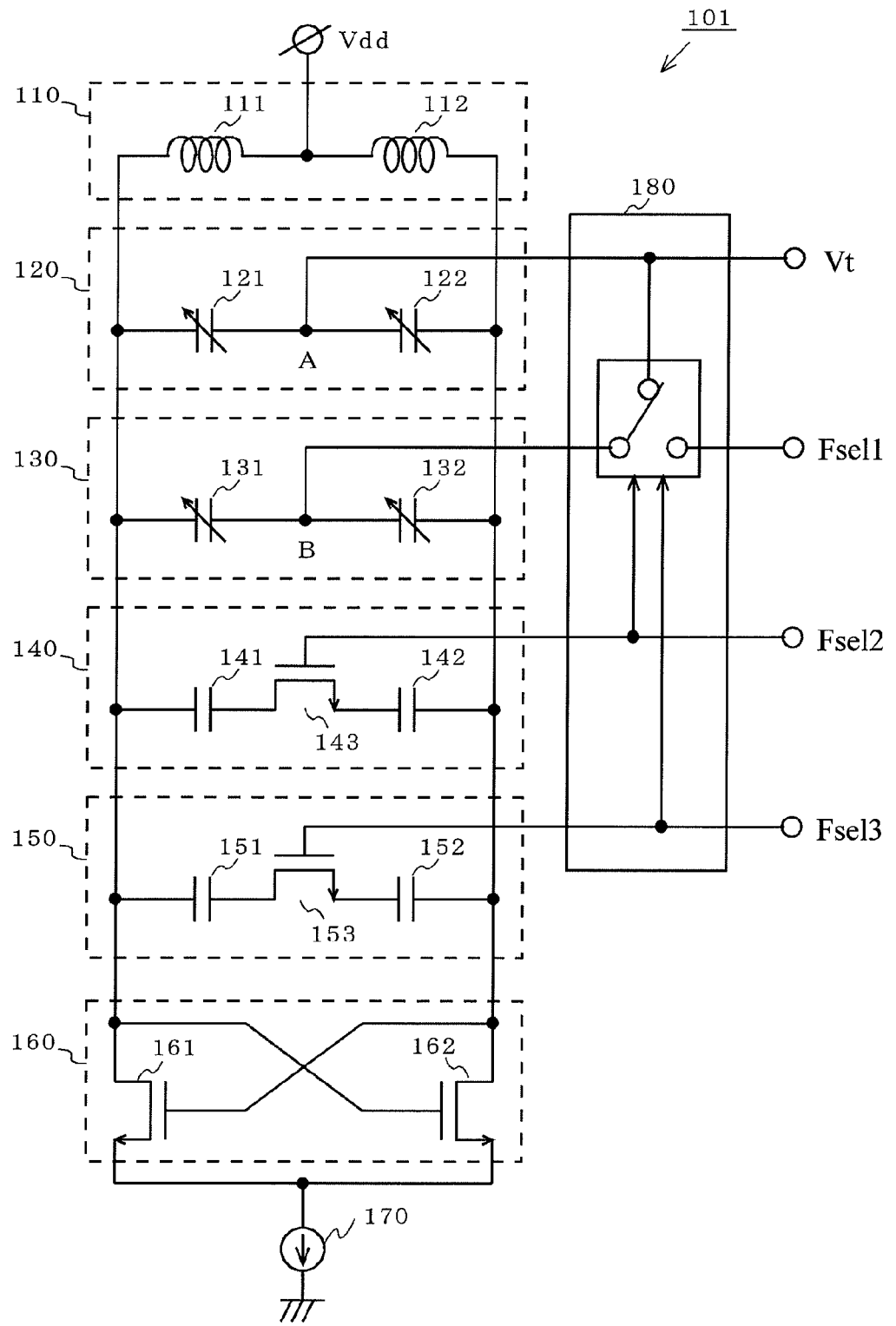
FIG. 1 is a diagram showing an exemplary configuration of a voltage controlled oscillator 101 according to a first embodiment of the present invention.

DESCRIPTION OF THE REFERENCE CHARACTERS 101-103, 303 voltage controlled oscillator
110 inductor circuit
111, 112 inductor
120, 130, 135 variable capacitance circuit
121, 122, 131, 132, 136, 137 variable capacitance element
140, 150 capacitance switch circuit
141, 142, 151, 152 capacitance
143, 153, 161, 162 transistor
160 negative resistance circuit
170 current source
180 frequency sensitivity controller
300 PLL circuit
301 phase comparator
302 loop filter
304 frequency divider
400 wireless communication device
401 antenna
402 power amplifier
403 modulator
404 switch
405 low noise amplifier
406 demodulator

BEST MODE FOR CARRYING OUT THE INVENTION

First Embodiment

FIG. 1 is a diagram showing an exemplary configuration of a voltage controlled oscillator 101 according to a first embodiment of the present invention. Here, a bias circuit and the like are omitted. In FIG. 1, the voltage controlled oscillator 101 of the first embodiment includes an inductor circuit 110, a first variable capacitance circuit 120, a second variable capacitance circuit 130, a first capacitance switch circuit 140, a second capacitance switch circuit 150, a negative resistance circuit 160, a current source 170, and a frequency sensitivity controller 180. The inductor circuit 110, the first variable capacitance circuit 120, the second variable capacitance circuit 130, the first capacitance switch circuit 140, the second capacitance switch circuit 150, and the negative resistance circuit 160 are connected in parallel with each other, and thus form an oscillation circuit.

The inductor circuit 110 includes inductors 111 and 112 connected in series, and a power supply voltage Vdd is supplied to a connection point between the inductors 111 and 112. The negative resistance circuit 160 is formed with two transistors 161 and 162 being cross-coupled. MOS transistors or bipolar transistors are suitable as the transistors 161 and 162.

The first variable capacitance circuit 120 includes variable capacitance elements 121 and 122 connected in series, and a control voltage Vt for feedback control of an oscillation frequency is applied to a connection point A (e.g., a virtual ground point for differential signals) between the variable capacitance elements 121 and 122. The second variable capacitance circuit 130 includes variable capacitance elements 131 and 132 connected in series, and the control voltage Vt or a control signal Fsel1 is applied, via the frequency sensitivity controller 180, to a connection point B (e.g., a virtual ground point for differential signals) between the variable capacitance elements 131 and 132. Each of the variable capacitance elements 121, 122, 131, and 132 is a variable capacitance element that utilizes a gate capacitance used in a CMOS process.

The first capacitance switch circuit 140 includes a MOS transistor 143, and capacitors 141 and 142 which are connected to the drain and source of the MOS transistor 143, respectively. A control signal Fsel2 is applied to the gate of the MOS transistor 143. The second capacitance switch circuit 150 includes a MOS transistor 153, and capacitors 151 and 152 which are connected to the drain and source of the MOS transistor 153, respectively. A control signal Fsel3 is applied to the gate of the MOS transistor 153. Each of the first and second capacitance switch circuits 140 and 150 forms a band-switch circuit.

Next, also with reference to FIG. 2A to FIG. 9B, a description will be given of a specific example of an operation of the voltage controlled oscillator 101 according to the first embodiment, which has the above-described structure.

First, a case will be considered in which the control voltage Vt is fixedly applied to both of the connection point A of the first variable capacitance circuit 120 and the connection point B of the second variable capacitance circuit 130. In this case, a frequency variable range of the voltage controlled oscillator 101 is determined based on four frequency ranges a (logical value 00), b (logical value 01), c (logical value 10), and d (logical value 11) (FIG. 2A), which are obtained by combinations of high level (logical value 1)/low level (logical value 0) of the control signal Fsel2 applied to the first capacitance switch circuit 140, and high level (logical value 1)/low level (logical value 0) of the control signal Fsel3 applied to the second capacitance switch circuit 150. The power supply voltage (=Vdd) and the ground voltage (=0V) are suitable for the high and low levels, respectively.

Figure 2A:
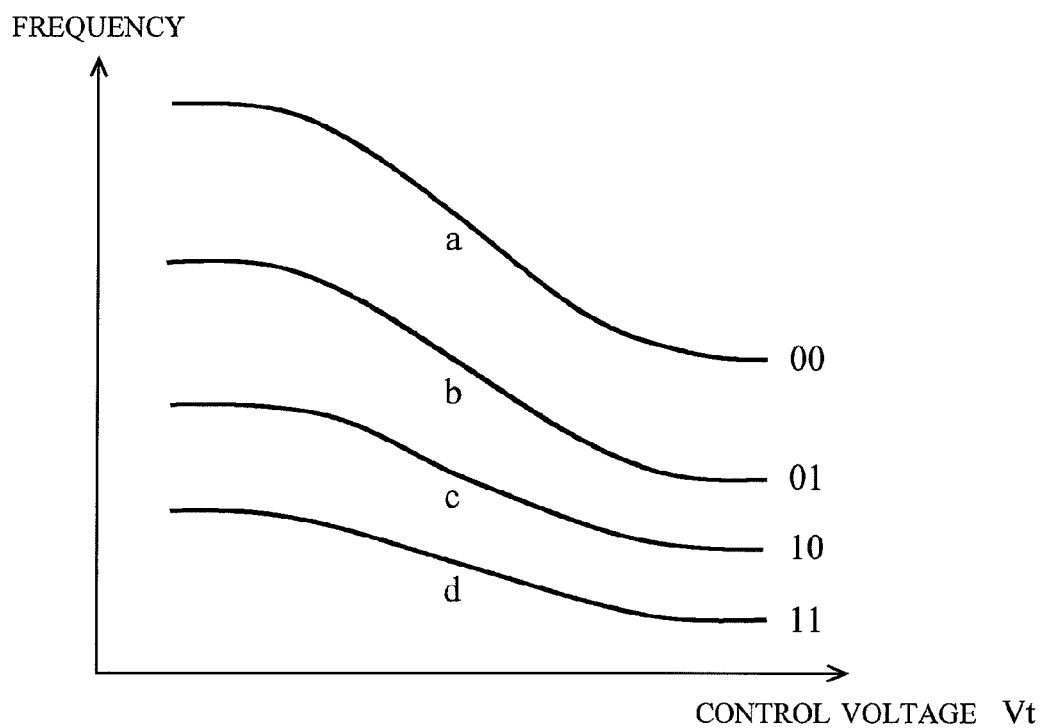
FIG. 2A is a diagram illustrating frequency characteristics of a conventional voltage controlled oscillator.
Figure 2B:
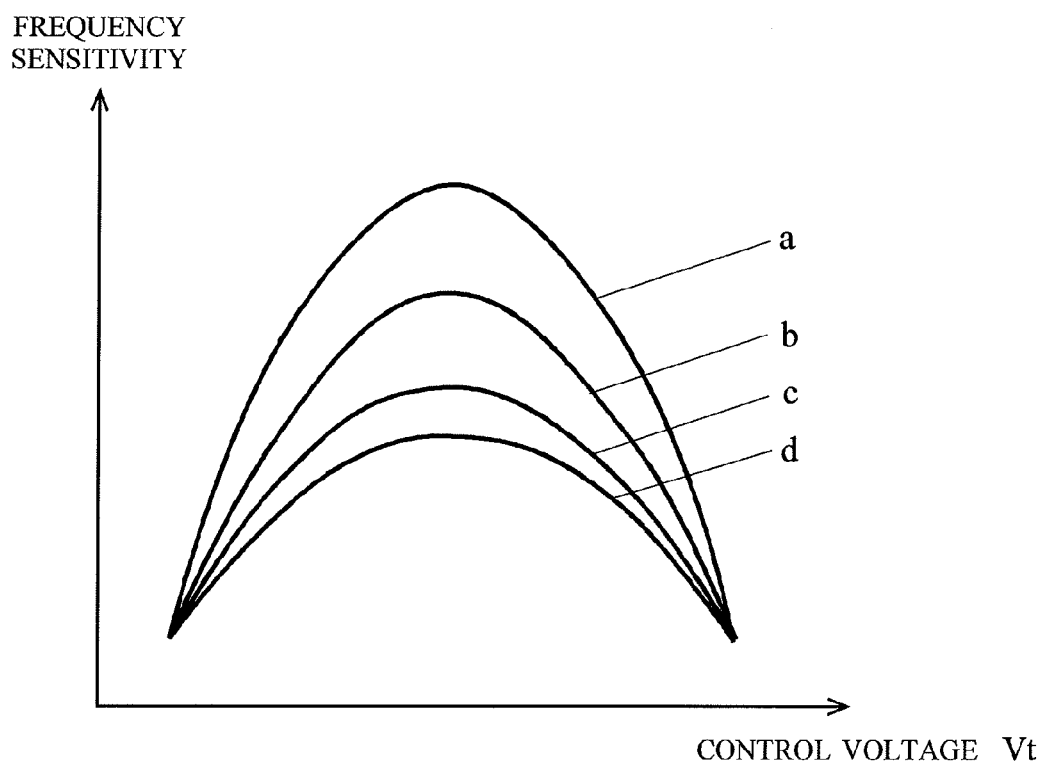
FIG. 2B is a diagram illustrating frequency sensitivity characteristics of the conventional voltage controlled oscillator.

In this case, however, a problem arises that a frequency sensitivity of the voltage controlled oscillator 101 becomes low in a low frequency range and becomes high in a high frequency range (FIG. 2B). Thus, an oscillation frequency (f) of the voltage controlled oscillator 101 is represented by the following equation, using: an inductance value L of the inductor circuit 110; a variable capacitance value Cv resulting from the variable capacitance circuits 120 and 130; and a fixed capacitance value Cc resulting from the capacitances of the capacitance switch circuits 140 and 150 and from a parasitic capacitance generated at the negative resistance circuit 160 and the like.

$$f = \frac{1}{2\pi \times \sqrt{L \times (C_V + C_C)}}$$

Here, the inductance value L is constant. The fixed capacitance value Cc differs among the four frequency ranges a to d. The fixed capacitance value Cc is minimum in the frequency range a which provides the highest oscillation frequency, and maximum in the frequency range d which provides the lowest oscillation frequency. Even when the frequency range changes among a to d, the variable capacitance value Cv is the same value as long as the control voltage Vt is constant. Accordingly, in the foregoing equation, in the frequency range d providing the lowest oscillation frequency (f), a capacitance value ratio Cv/(Cc+Cv), which is a ratio of the variable capacitance value Cv to the total capacitance value Cc+Cv, is minimum, so that the frequency sensitivity decreases. On the other hand, in the frequency range a providing the highest oscillation frequency (f), the capacitance value ratio Cv/(Cc+Cv) is maximum, so that the frequency sensitivity increases.

Therefore, in the present invention, when a high frequency range is selected by the first and second capacitance switch circuits 140 and 150, the frequency sensitivity controller 180 switches the control voltage Vt, which is applied to the connection point B of the second variable capacitance circuit 130, to the control signal Fsel1. That is, the frequency sensitivity controller 180 causes the second variable capacitance circuit 130 to function as a fixed capacitance circuit, to thereby use the second variable capacitance circuit 130 as a band-switch circuit.

Figure 3A:
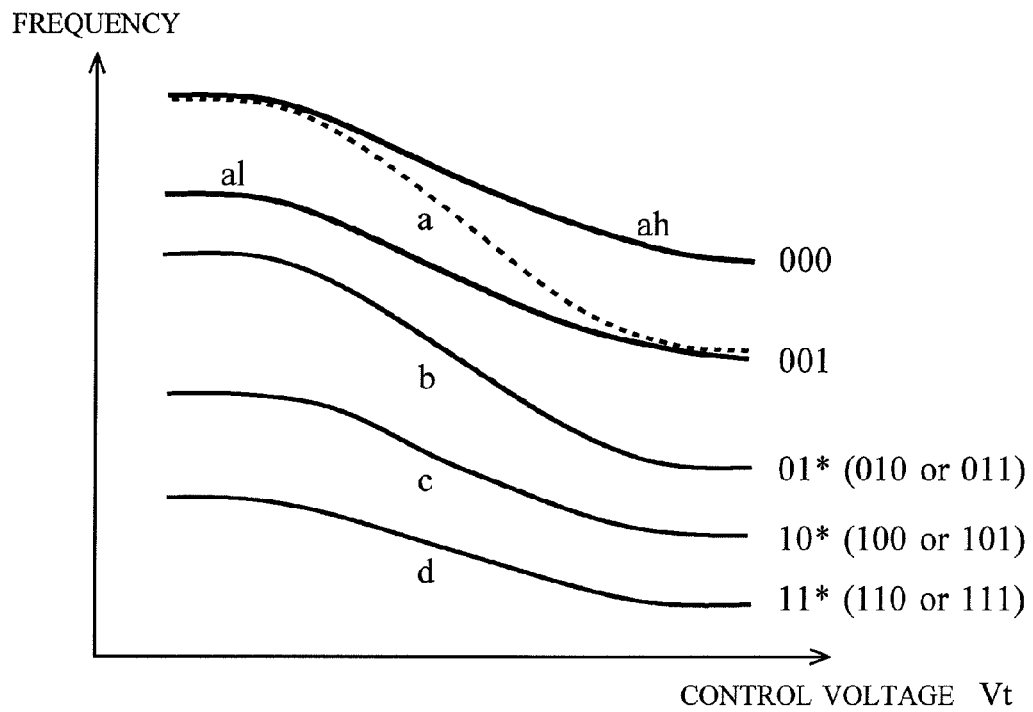
FIG. 3A is a diagram illustrating frequency characteristics of the voltage controlled oscillator 101 according to the first embodiment.
Figure 3B:
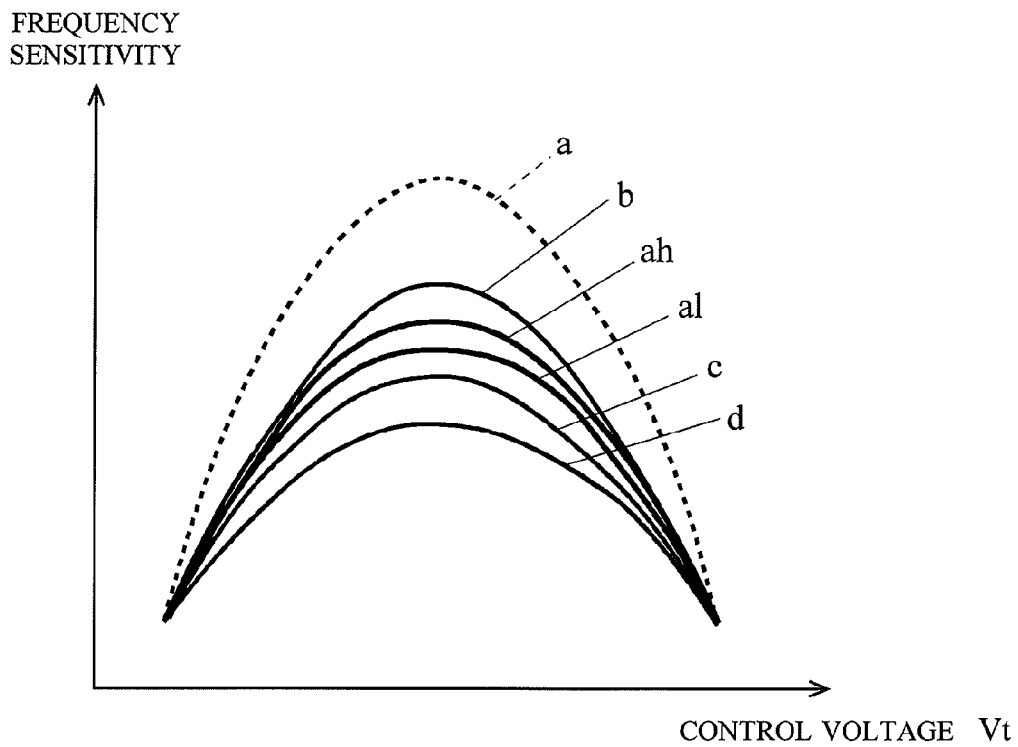
FIG. 3B is a diagram illustrating frequency sensitivity characteristics of the voltage controlled oscillator 101 according to the first embodiment.
Figure 4:
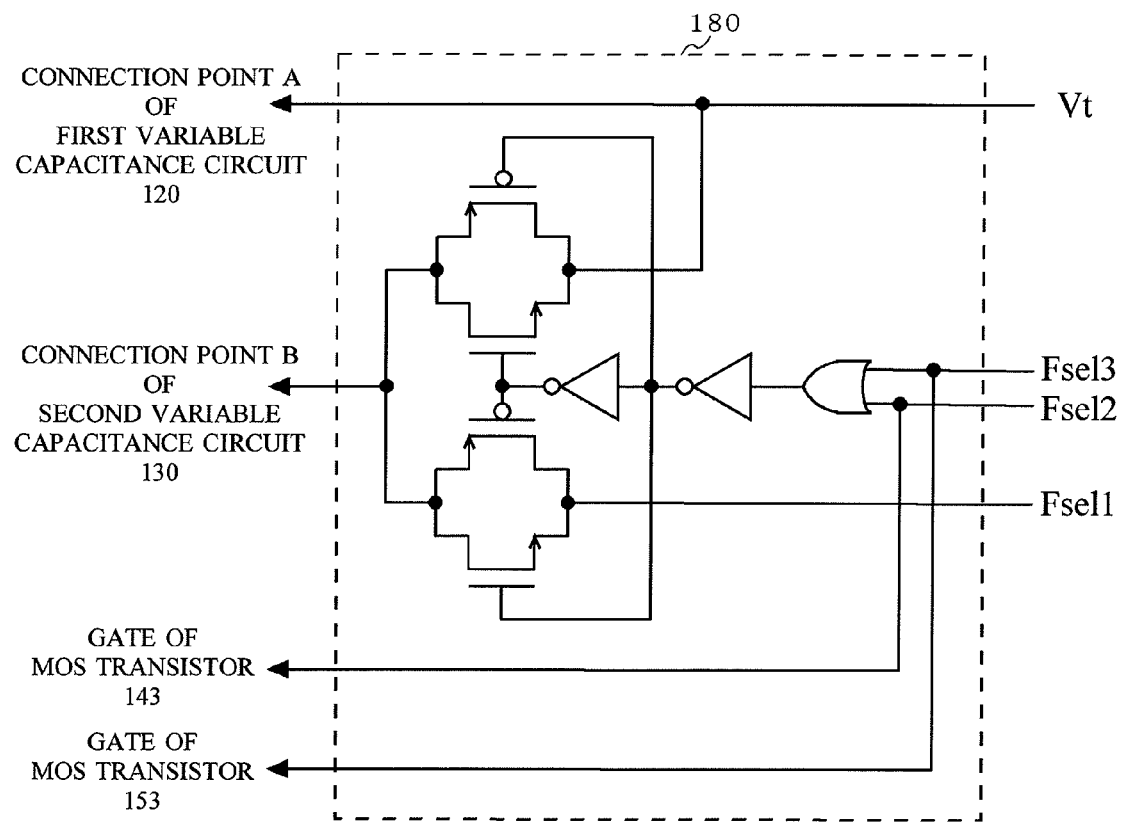
FIG. 4 is a diagram showing a detailed configuration of a frequency sensitivity controller 180 according to the first embodiment.

In a case of the high-frequency range a which is obtained when both of the control signals Fsel2 and Fsel3 are at the low level, the frequency sensitivity controller 180 applies the control signal Fsel1 to the connection point B of the second variable capacitance circuit 130, and switches between the high level and the low level. As a result of this control, the high-frequency variable range a is divided into two, namely, a variable range ah (logical value 000), which is based on upper frequencies, and a variable range al (logical value 001), which is based on lower frequencies (FIG. 3A). Thus, the frequency sensitivity can be suppressed without narrowing the high-frequency variable range a (FIG. 3B). A specific example of a circuit of the frequency sensitivity controller 180 for realizing the present embodiment is shown in FIG. 4. In FIG. 3A and FIG. 4, the mark "*" denotes that the logical value may be either 1 or 0.

Second Embodiment

Figure 5:
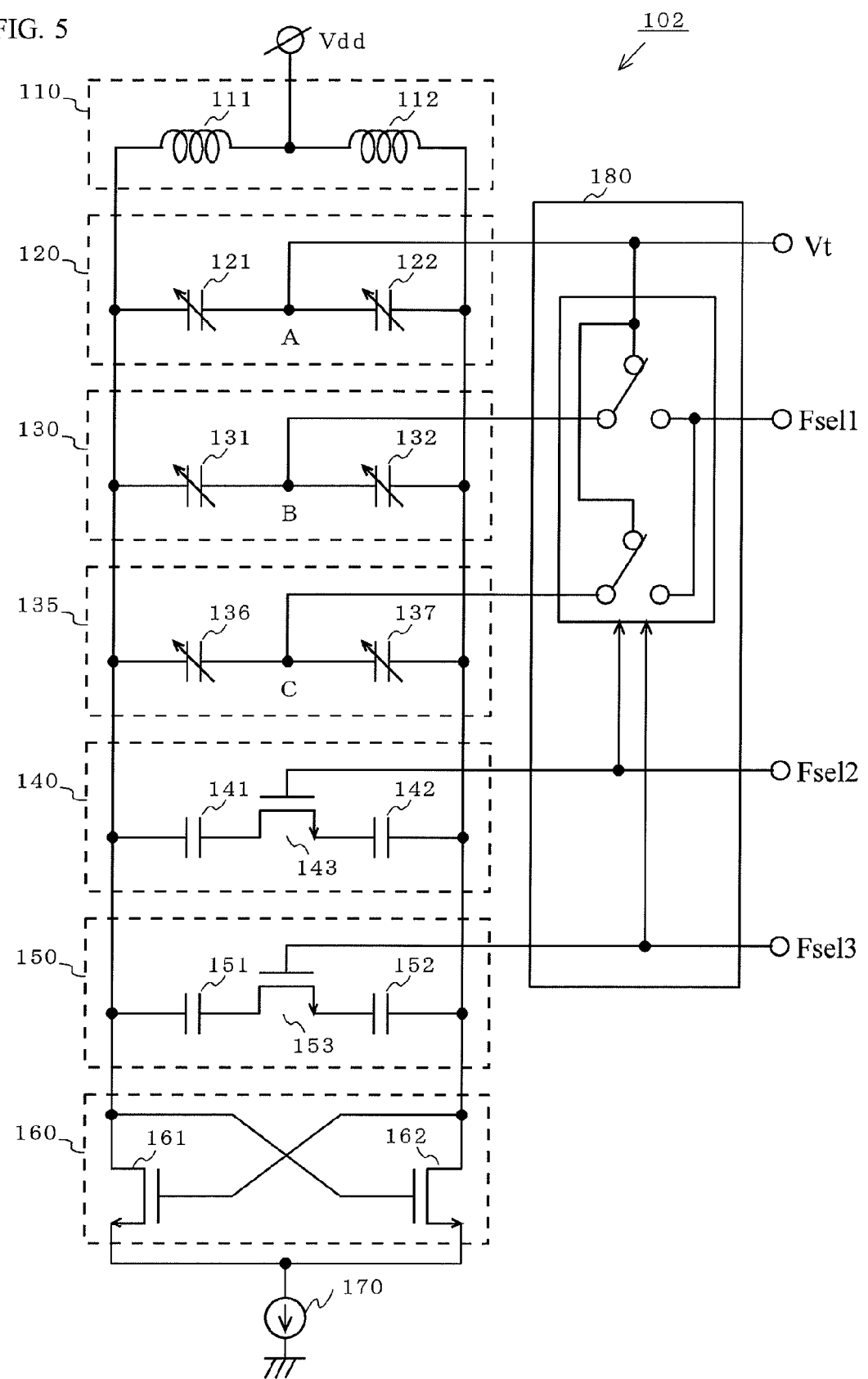
FIG. 5 is a diagram showing an exemplary configuration of a voltage controlled oscillator 102 according to a second embodiment of the present invention.

FIG. 5 is a diagram showing an exemplary configuration of a voltage controlled oscillator 102 according to a second embodiment of the present invention. Here, a bias circuit and the like are omitted. In FIG. 5, the voltage controlled oscillator 102 of the second embodiment has a third variable capacitance circuit 135, in addition to the same structure as that of the voltage controlled oscillator 101 of the first embodiment described above.

The third variable capacitance circuit 135 includes variable capacitance elements 136 and 137 connected in series, and the control voltage Vt or the control signal Fsel1 is applied, via the frequency sensitivity controller 180, to a connection point C (e.g., a virtual ground point for differential signals) between the variable capacitance elements 136 and 137. In the second embodiment, the frequency sensitivity controller 180 applies the control voltage Vt or the control signal Fsel1 to the connection point C (e.g., a virtual ground point for differential signals) of the third variable capacitance circuit 135, so that the third variable capacitance circuit 135 is used not only as the variable capacitance circuit but also as a band-switch circuit.

Figure 6A:
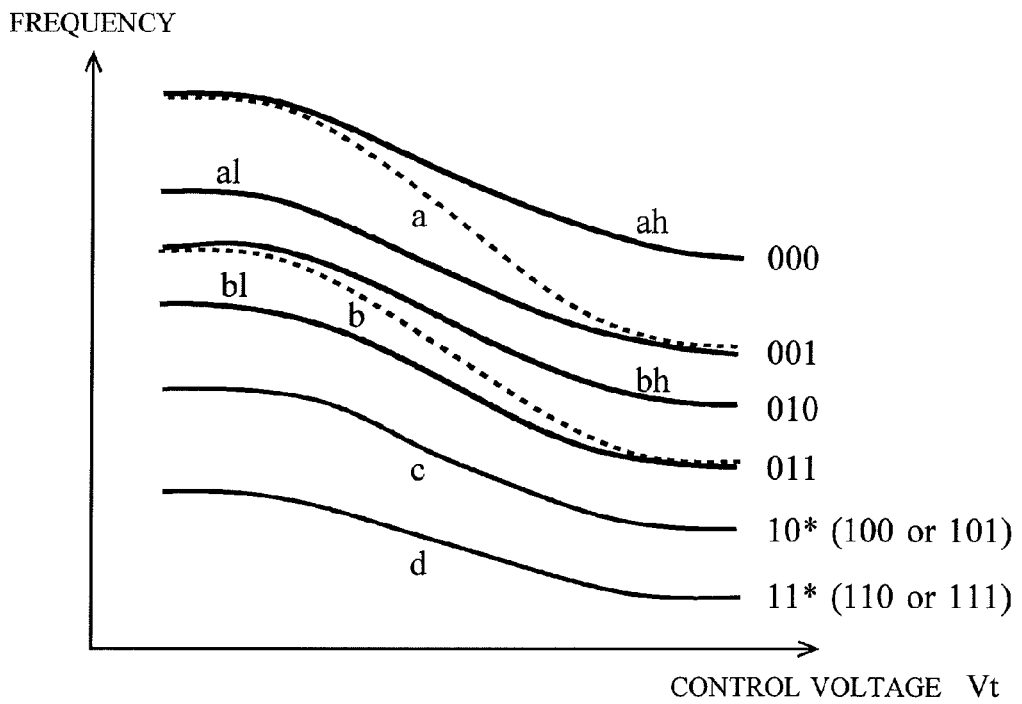
FIG. 6A is a diagram illustrating frequency characteristics of the voltage controlled oscillator 102 according to the second embodiment.
Figure 6B:
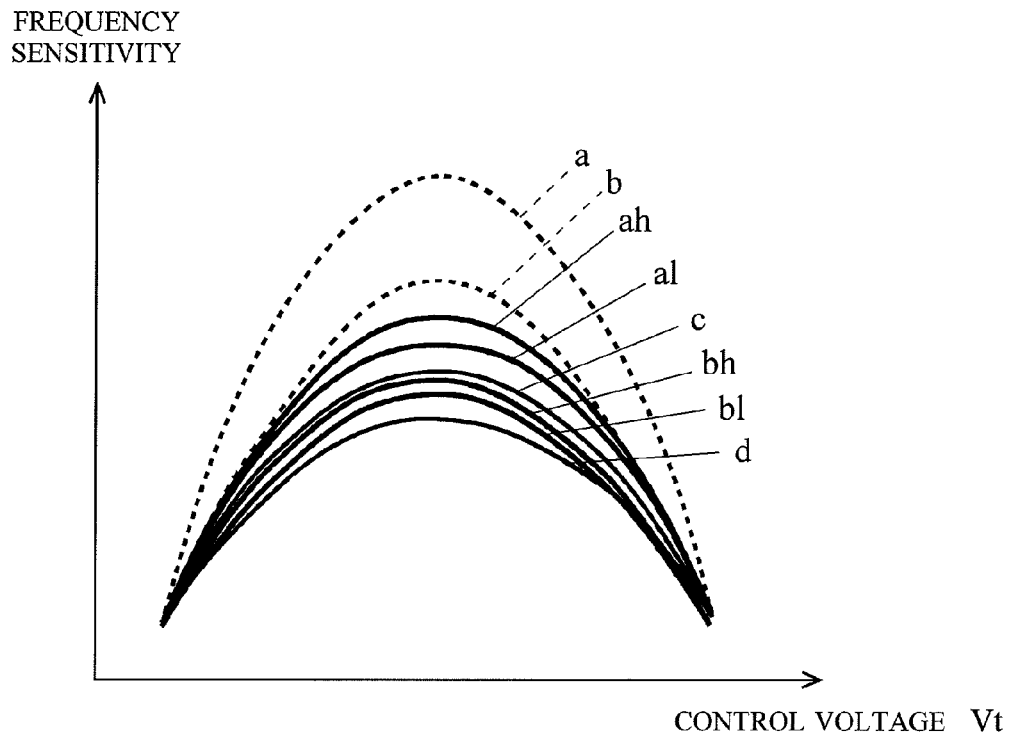
FIG. 6B is a diagram illustrating frequency sensitivity characteristics of the voltage controlled oscillator 102 according to the second embodiment.
Figure 7:
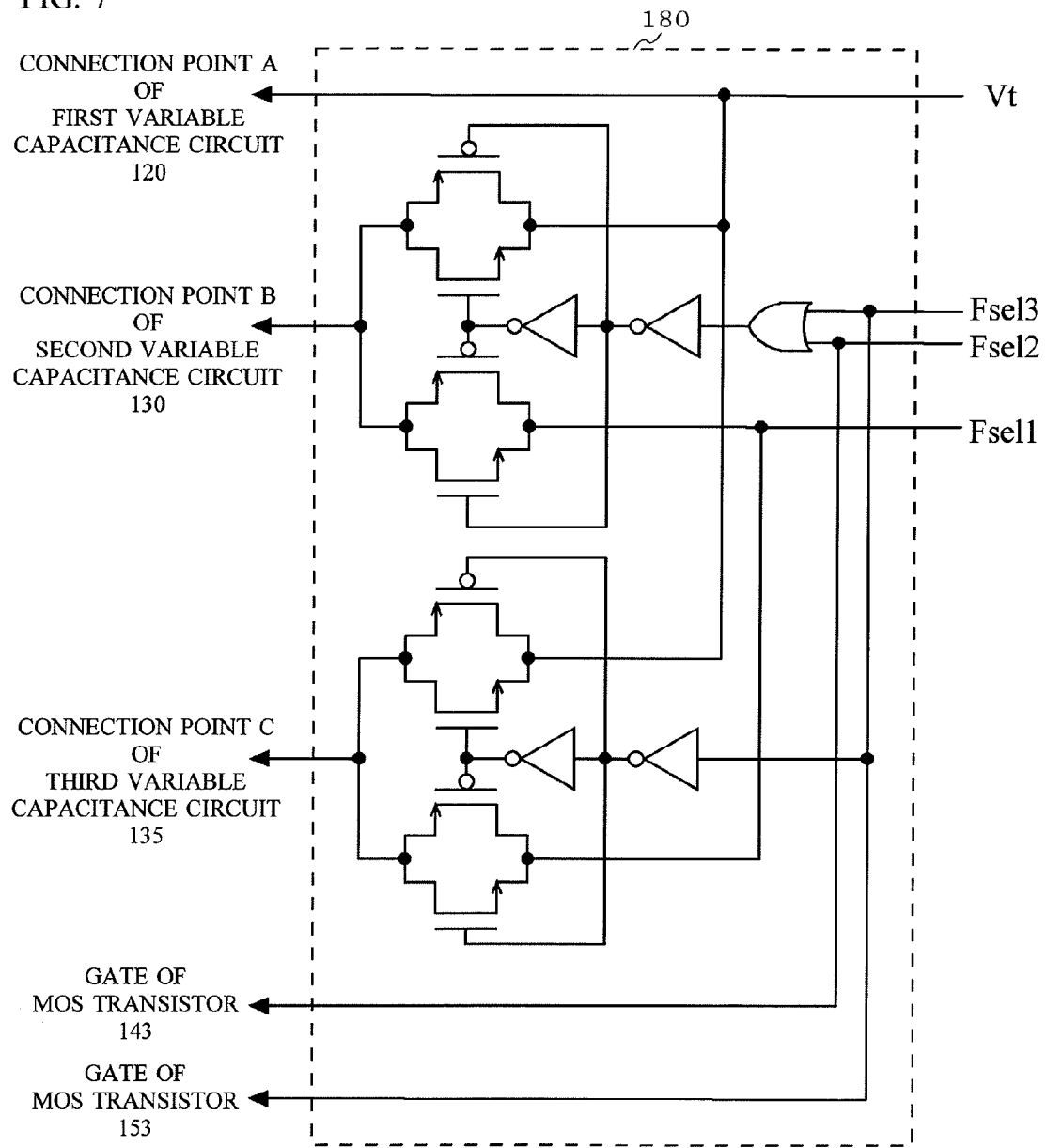
FIG. 7 is a diagram showing a detailed configuration of a frequency sensitivity controller 180 according to the second embodiment.

In a case of the high-frequency range a which is obtained when both of the control signals Fsel2 and Fsel3 are at the low level, the frequency sensitivity controller 180 applies the control signal Fsel1 to the connection point B of the second variable capacitance circuit 130, and switches between the high level and the low level. At this time, the control signal Fsel1 is applied to the connection point C of the third variable capacitance circuit 135. In a case of the high-frequency range b which is obtained when the control signal Fsel2 is at the high level and the control signal Fsel3 is at the low level, the frequency sensitivity controller 180 applies the control signal Fsel1 to the connection point C of the third variable capacitance circuit 135, and switches between the high level and the low level. At this time, the control voltage Vt is applied to the connection point B of the second variable capacitance circuit 130. As a result of this control, the frequency variable range a is divided into two, namely, a variable range ah (logical value 000), which is based on upper frequencies, and a variable range al (logical value 001), which is based on lower frequencies, and also the frequency variable range b is divided into two, namely, a variable range bh (logical value 010), which is based on upper frequencies, and a variable range bl (logical value 011), which is based on lower frequencies (FIG. 6A). Thus, the frequency sensitivity can be suppressed without narrowing the high-frequency variable ranges a and b (FIG. 6B). A specific example of a circuit of the frequency sensitivity controller 180 for realizing the present embodiment is shown in FIG. 7. In FIG. 6A and FIG. 7, the mark "*" denotes that the logical value may be either 1 or 0.

Third Embodiment

The configurations of the voltage controlled oscillators 101 and 102 shown in FIGS. 1 and 5 are merely examples. The voltage controlled oscillator according to the present invention may have any configuration, as long as the configuration includes two or more variable capacitance circuits and at least one capacitance switch circuit. For example, use of a configuration shown in FIGS. 8A to 8C enables the following control.

In a case where signals of different frequencies (a high band and a low band) are outputted by using a single voltage controlled oscillator, generally, a high-band signal outputted from the voltage controlled oscillator is converted into a low-band signal via a 1/n frequency divider. In this case, it is preferable that a frequency sensitivity of the low-band signal outputted from the 1/n frequency divider and a frequency sensitivity of the high-band signal outputted from the voltage controlled oscillator are made coincident with each other. For this purpose, therefore, it is necessary that, in a case of outputting the low-band signal, the frequency sensitivity of the signal outputted from the voltage controlled oscillator is n times higher than the frequency sensitivity in a case of outputting the high-band signal.

Figure 8A:
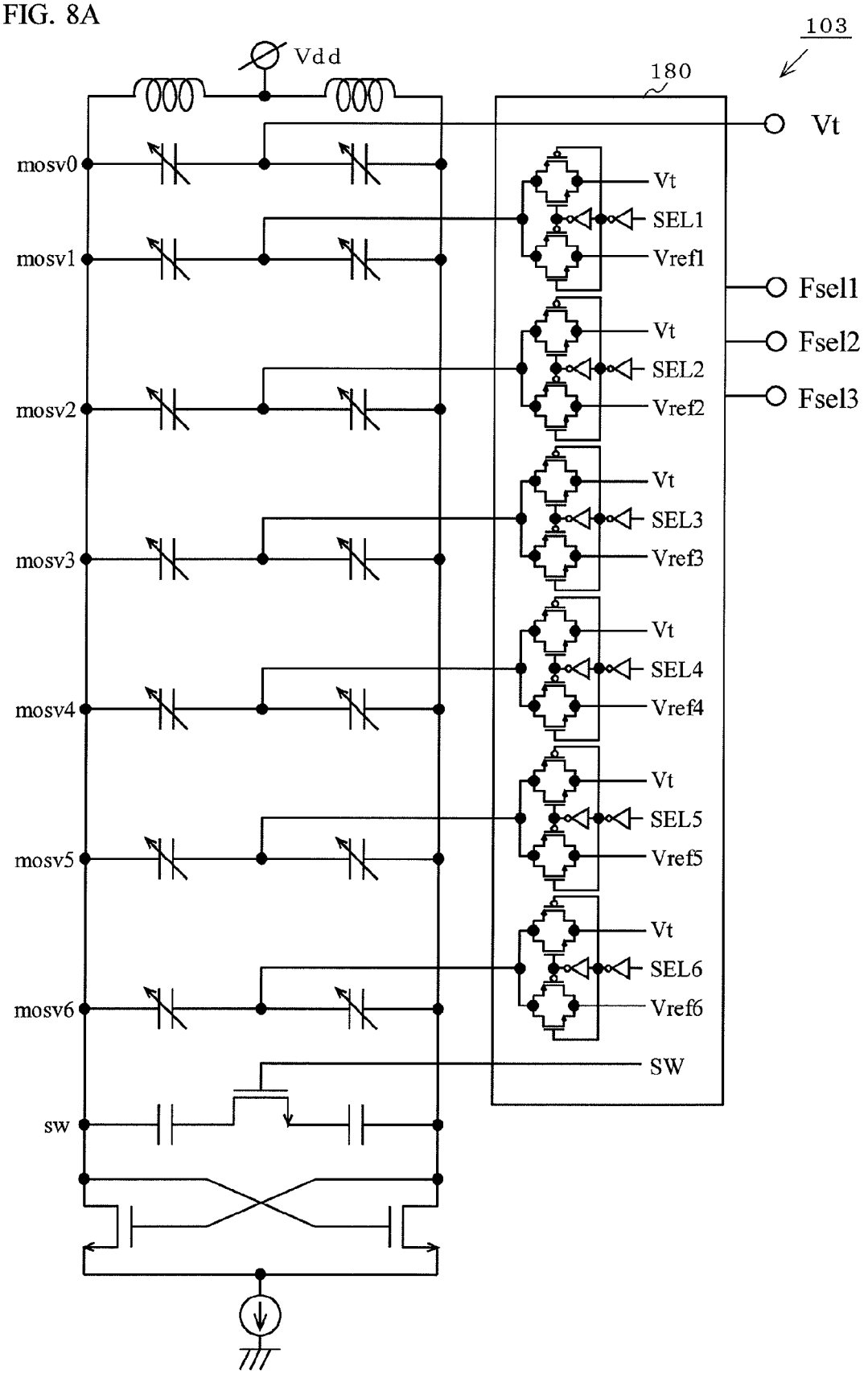
FIG. 8A is a diagram showing a configuration of a voltage controlled oscillator 103 according to a third embodiment of the present invention.
Figure 8B:
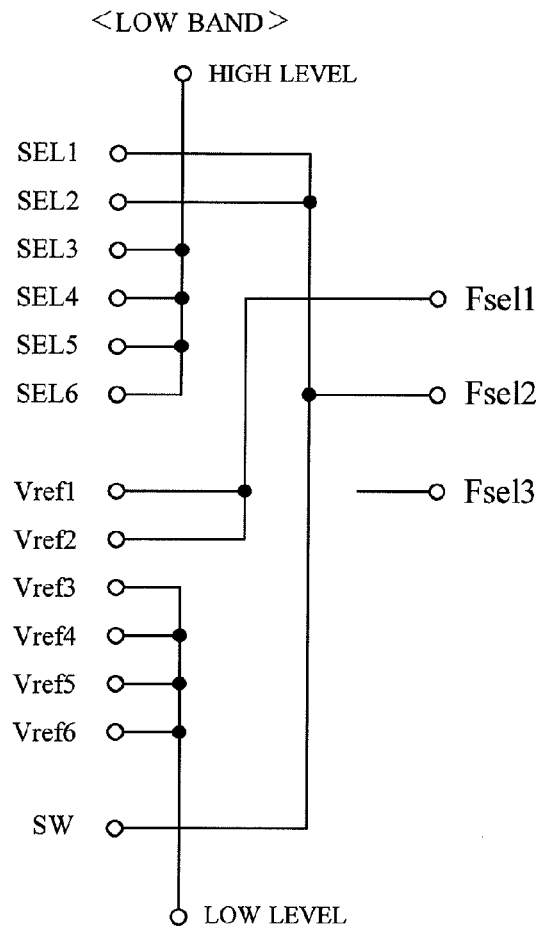
FIG. 8B is a diagram showing a detailed connection within the frequency sensitivity controller 180 shown in FIG. 8A.
Figure 8C:
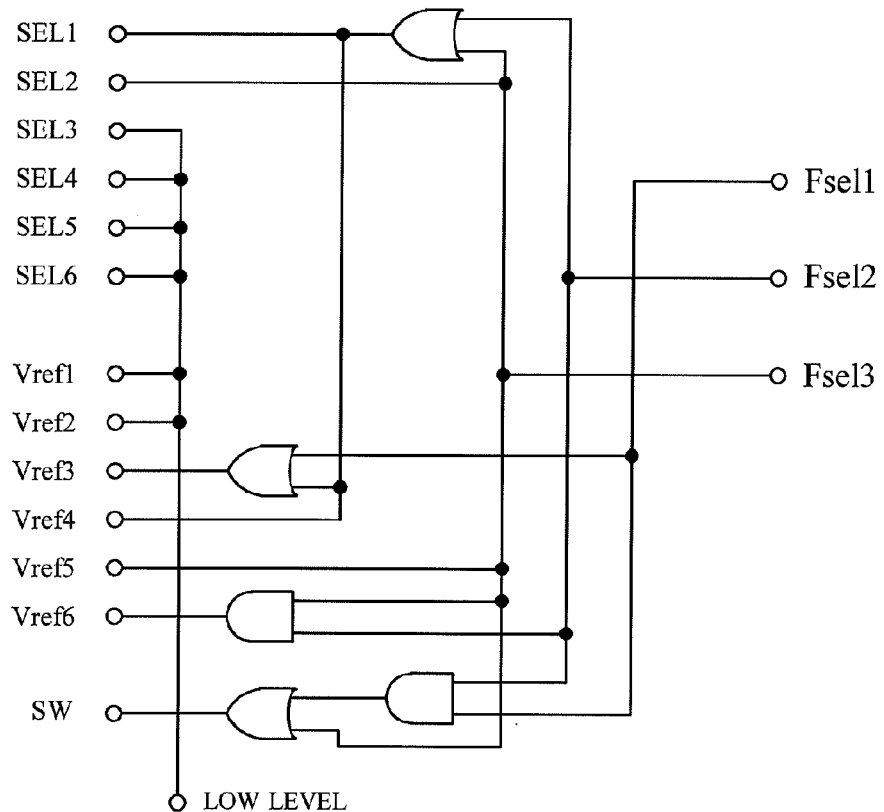
FIG. 8C is a diagram showing another detailed connection within the frequency sensitivity controller 180 shown in FIG. 8A.
Figure 9A:
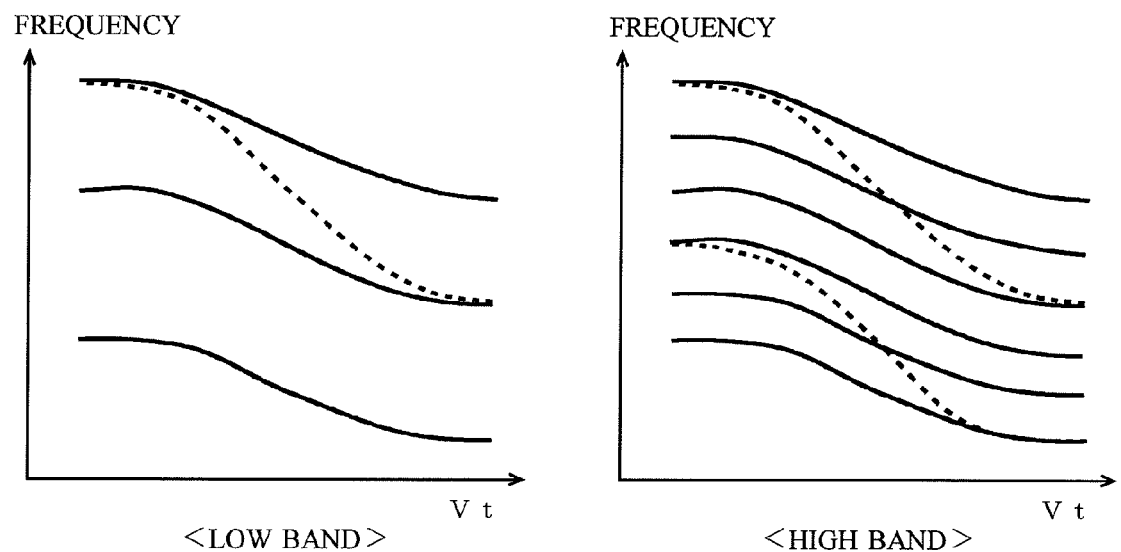
FIG. 9A is a diagram illustrating frequency characteristics of the voltage controlled oscillator 103 according to the third embodiment.
Figure 9B:
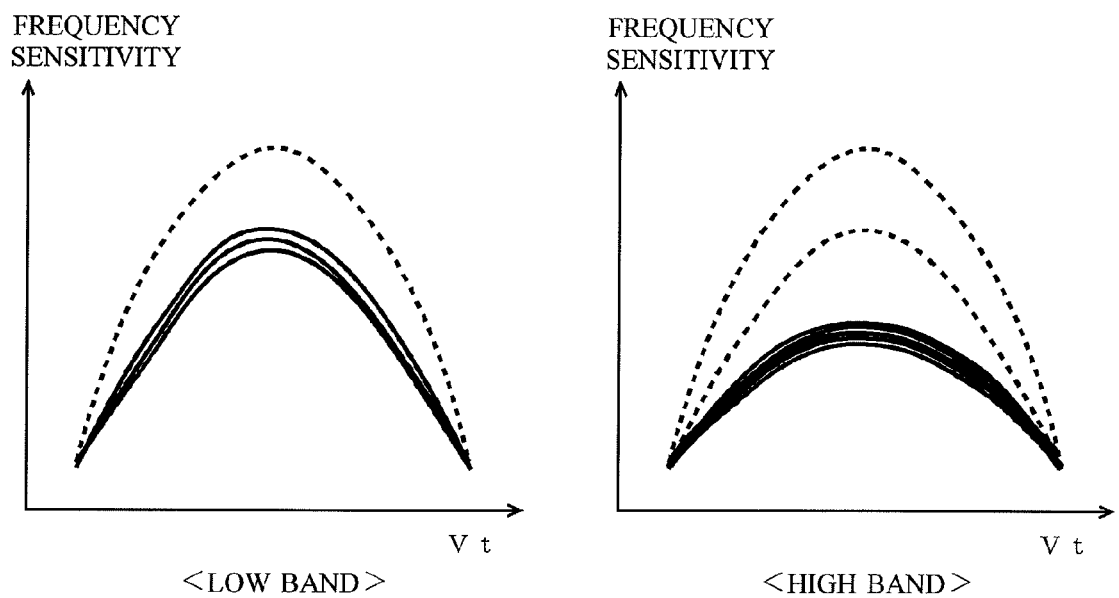
FIG. 9B is a diagram illustrating frequency sensitivity characteristics of the voltage controlled oscillator 103 according to the third embodiment.

A specific example of a configuration of a voltage controlled oscillator 103 in which n=2 is shown in FIG. 8A, and specific connections within the frequency sensitivity controller 180 are shown in FIGS. 8B and 8C. As shown in these figures, seven variable capacitance circuits mosv0 to mosv6, and one capacitance switch circuit sw are combined, so that a high band is divided into six frequency ranges and a low band is divided into three frequency ranges. Thus, the frequency sensitivity in the case of outputting the high-band can be set to approximately ½ of the frequency sensitivity in the case of outputting the low-band (FIGS. 9A and 9B).

Figure 10A:
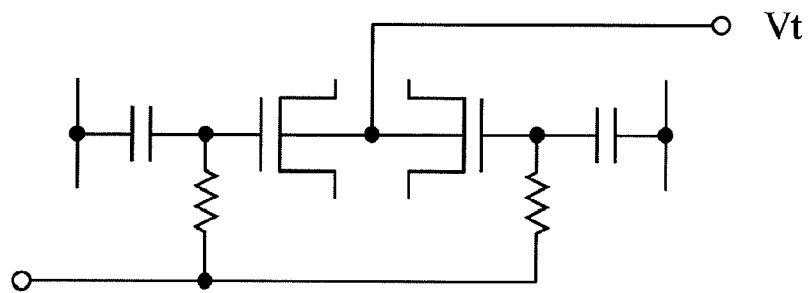
FIG. 10A is a diagram illustrating another variable capacitance circuit usable in the voltage controlled oscillator according to the present invention.
Figure 10B:
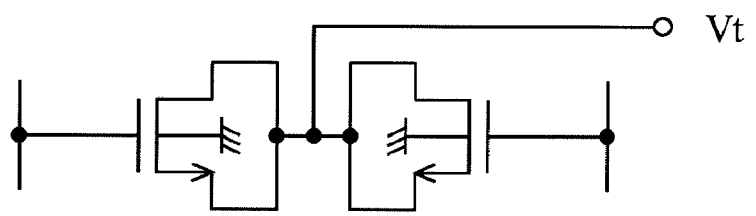
FIG. 10B is a diagram illustrating another variable capacitance circuit usable in the voltage controlled oscillator according to the present invention.
Figure 10C:
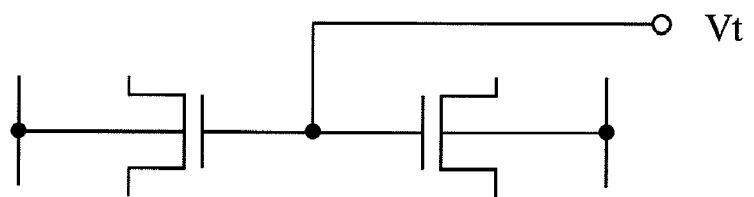
FIG. 10C is a diagram illustrating another variable capacitance circuit usable in the voltage controlled oscillator according to the present invention.
Figure 10D:
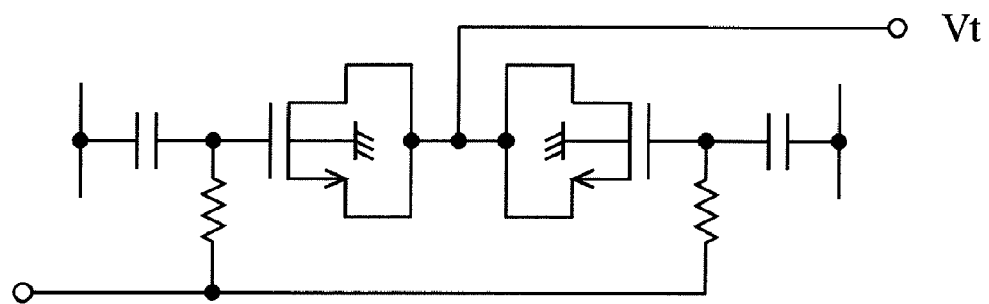
FIG. 10D is a diagram illustrating another variable capacitance circuit usable in the voltage controlled oscillator according to the present invention.
Figure 10E:
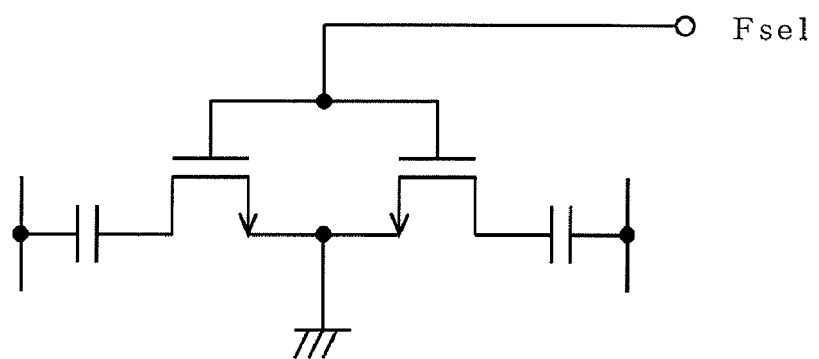
FIG. 10E is a diagram illustrating another capacitance switch circuit usable in the voltage controlled oscillator according to the present invention.

For the variable capacitance circuit of the voltage controlled oscillator according to the present invention, not only the configuration shown in FIG. 1 and the like, but also a configuration using an Inversion type MOS transistor, an Accumulation type MOS transistor, or C-coupling may be adopted (FIGS. 10A to 10D). Moreover, for the capacitance switch circuit of the voltage controlled oscillator according to the present invention, not only the configuration shown in FIG. 1 and the like, but also a configuration shown in FIG. 10E may be adopted.

[Exemplary Configuration Using Voltage Controlled Oscillator]

Figure 11:
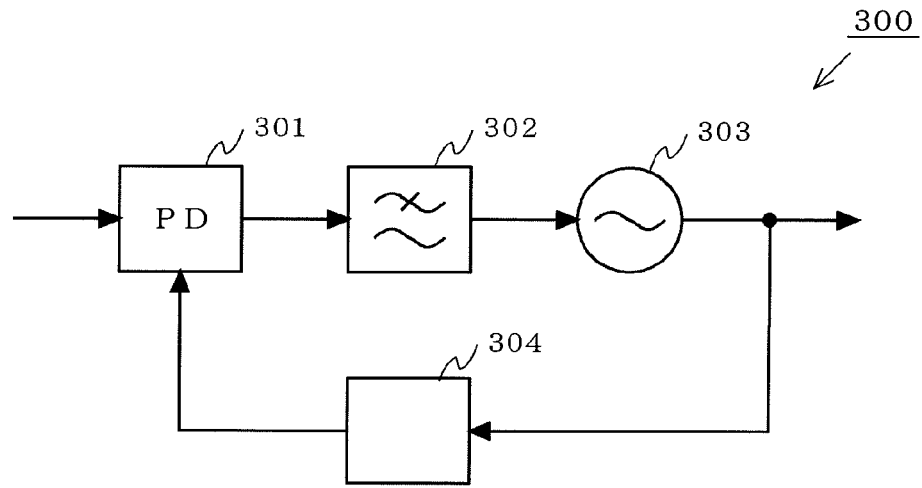
FIG. 11 is a diagram showing a configuration of a PLL circuit 300 using the voltage controlled oscillator according to the present invention.

FIG. 11 is a diagram showing an exemplary configuration of a PLL circuit 300 using any of the voltage controlled oscillators 101 to 103 according to the first to third embodiments of the present invention. In FIG. 11, the PLL circuit 300 includes a phase comparator 301, a loop filter 302, a voltage controlled oscillator 303 of the present invention, and a frequency divider 304.

The phase comparator 301 compares an inputted reference signal with a signal obtained by the frequency divider 304 dividing an output signal of the voltage controlled oscillator 303. A signal outputted from the phase comparator 301 is inputted, as a control voltage Vt, to the voltage controlled oscillator 303 via the loop filter 302. Based on the control voltage Vt, the voltage controlled oscillator 303 outputs a signal of a desired frequency. Using this configuration, the PLL circuit 300 locks the desired frequency. It is noted that a mixer may be used instead of the frequency divider 304, or the frequency divider 304 and a mixer may be used in combination.

Figure 12:
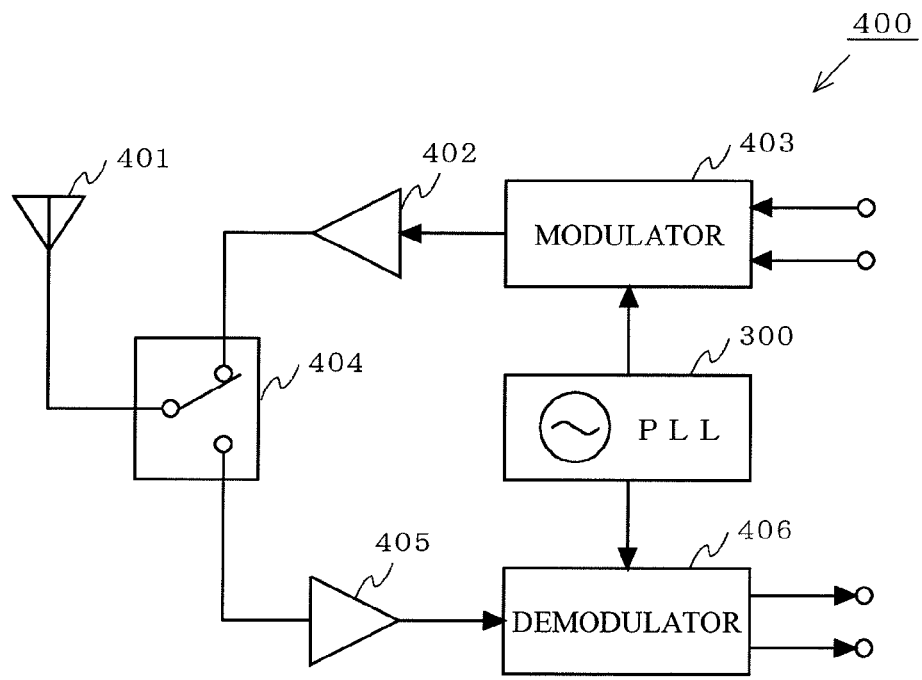
FIG. 12 is a diagram showing a configuration of a wireless communication device using the PLL circuit shown in FIG. 11.
Figure 13:
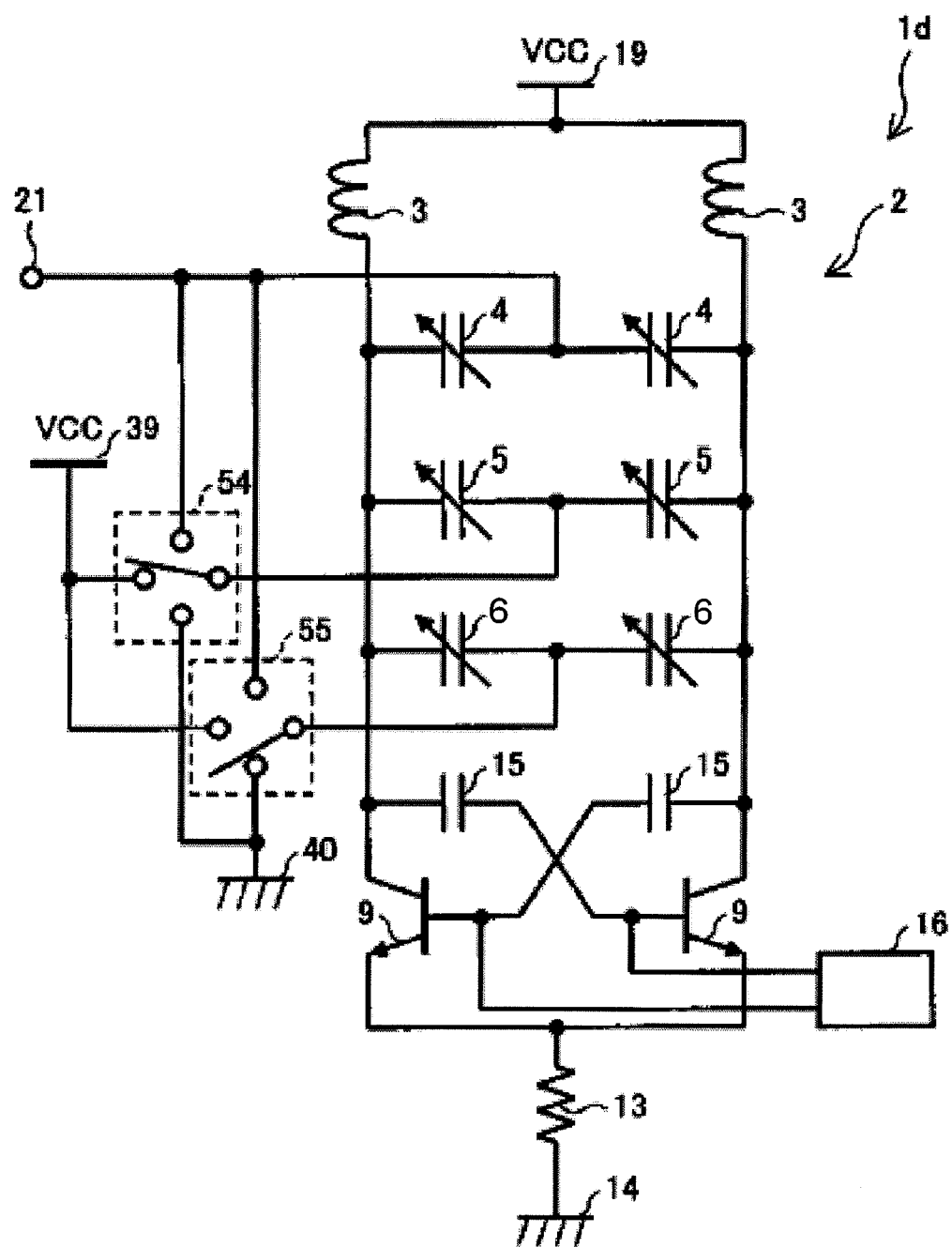
FIG. 13 is a diagram showing a configuration of a conventional voltage controlled oscillator 1d.
Figure 14:
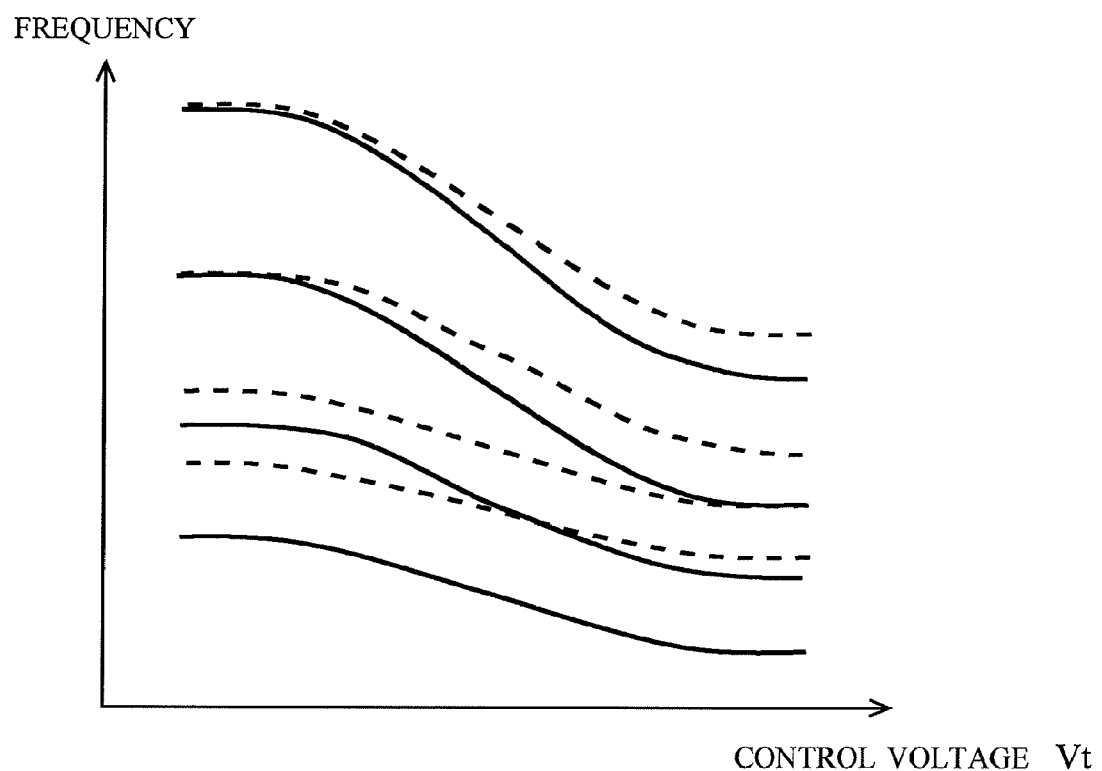
FIG. 14 is a diagram for illustrating a problem of the conventional voltage controlled oscillator 1d.

FIG. 12 is a diagram showing an exemplary configuration of a wireless communication device 400 using the above-described PLL circuit 300. In FIG. 12, the wireless communication device 400 includes an antenna 401, a power amplifier 402, a modulator 403, a switch 404, a low noise amplifier 405, a demodulator 406, and a PLL circuit 300.

For transmitting a wireless signal, the modulator 403 modulates a desired radio frequency signal, which is outputted from the PLL circuit 300, with a baseband modulation signal, and outputs the resulting signal. The modulated radio frequency signal outputted from the modulator 403 is amplified by the power amplifier 402, and radiated from the antenna 401 via the switch 404. For receiving a wireless signal, a modulated radio frequency signal received by the antenna 401 is inputted to the low noise amplifier 405 via the switch 404, amplified, and inputted to the demodulator 406. The demodulator 406 demodulates the modulated radio frequency signal inputted thereto, into a baseband modulation signal by using the radio frequency signal outputted from the PLL circuit 300. It is noted that the PLL circuit 300 may be used at each of the transmitter side and the receiver side. Moreover, the PLL circuit 300 may serve also as a modulator.

As described above, the voltage controlled oscillator according to the present invention, and the PLL circuit and the wireless communication device each using the voltage controlled oscillator, make it possible to, while suppressing deterioration of phase noise characteristics, variably control an oscillation frequency over a wide range with a frequency sensitivity being kept low.

INDUSTRIAL APPLICABILITY

The voltage controlled oscillator according to the present invention is usable for, e.g., generating a local oscillation signal for a wireless communication device, and particularly useful in a case where, for example, an oscillation frequency is variably controlled over a wide range with a frequency sensitivity being kept low while deterioration of phase noise characteristics is suppressed.

The invention claimed is:
1. A voltage controlled oscillator comprising:
an inductor circuit including an inductor;
a plurality of variable capacitance circuits, each of the plurality of variable capacitance circuits including a variable capacitance element;
at least one capacitance switch circuit;

a negative resistance circuit; and a frequency sensitivity controller configured to apply various combinations of a control voltage and a plurality of control signals to the plurality of variable capacitance circuits and the at least one capacitance switch circuit, wherein:

the inductor circuit, the plurality of variable capacitance circuits, the at least one capacitance switch circuit, and the negative resistance circuit are connected in parallel;

the frequency sensitivity controller:

is connected to a respective virtual ground point for differential signals of each of the plurality of variable capacitance circuits;

fixedly applies the control voltage for feedback control of an oscillation frequency, to one variable capacitance circuit of the plurality of variable capacitance circuits; and applies one of (i) the control voltage and (ii) one control signal of the plurality of control signals, to another variable capacitance circuit of the plurality of variable capacitance circuits, based on another control signal, of the plurality of control signals, applied to the at least one capacitance switch circuit; and when the one control signal of the plurality of control signals is applied to the another variable capacitance circuit of the plurality of variable capacitance circuits, the one control signal is capable of varying between at least two voltage levels.

2. The voltage controlled oscillator according to claim 1, wherein the frequency sensitivity controller applies the one control signal of the plurality of control signals to the another variable capacitance circuit of the plurality of variable capacitance circuits, when a control signal, of the plurality of control signals, of a low level that does not cause a switch-on is applied to all of the at least one capacitance switch circuit.

3. The voltage controlled oscillator according to claim 1, wherein the frequency sensitivity controller applies the control voltage to all of the plurality of variable capacitance circuits, when a control signal, of the plurality of control signals, of a high level that causes a switch-on is applied to all of the at least one capacitance switch circuit.

4. The voltage controlled oscillator according to claim 1, wherein at least one variable capacitance element of the plurality of variable capacitance circuits has an Inversion type MOS structure or an Accumulation type MOS structure.

5. A PLL circuit comprising the voltage controlled oscillator according to claim 1.

6. A radio communication device comprising the voltage controlled oscillator according to claim 1.

* * * * *